United States Patent
Sato et al.

(10) Patent No.: US 8,778,515 B2
(45) Date of Patent: Jul. 15, 2014

(54) MAGNETO-RESISTIVE EFFECT ELEMENT, MAGNETIC HEAD, AND MAGNETIC RECORDING/READING APPARATUS

(75) Inventors: Yo Sato, Kanagawa (JP); Katsumi Hoshino, Kanagawa (JP); Hiroyuki Hoshiya, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 866 days.

(21) Appl. No.: 12/313,607

(22) Filed: Nov. 21, 2008

(65) Prior Publication Data

US 2009/0168266 A1   Jul. 2, 2009

(30) Foreign Application Priority Data

Dec. 28, 2007   (JP) ................. 2007-339432

(51) Int. Cl.
| | |
|---|---|
| *G11B 5/127* | (2006.01) |
| *G01R 33/09* | (2006.01) |
| *G11B 5/39* | (2006.01) |
| *B82Y 10/00* | (2011.01) |
| *B82Y 25/00* | (2011.01) |

(52) U.S. Cl.
CPC ............ *G01R 33/091* (2013.01); *G01R 33/093* (2013.01); *G01R 33/098* (2013.01); *G11B 5/3906* (2013.01); *G11B 2005/3996* (2013.01); *B82Y 10/00* (2013.01); *B82Y 25/00* (2013.01)
USPC .................. 428/811.2; 428/811.1; 428/811.5; 360/324.1; 360/324.12; 360/324.2; 257/421; 257/425

(58) Field of Classification Search
None
See application file for complete search history.

(56) References Cited

U.S. PATENT DOCUMENTS

| | | | |
|---|---|---|---|
| 7,336,451 B2 | 2/2008 | Saito | |
| 7,381,480 B2 | 6/2008 | Nakamura et al. | |
| 7,583,481 B2 * | 9/2009 | Zhang et al. ............. | 360/324.11 |
| 7,785,662 B2 * | 8/2010 | Fuji et al. .................. | 427/248.1 |
| 7,859,797 B2 | 12/2010 | Hoshino et al. | |
| 8,189,304 B2 * | 5/2012 | Okamura et al. ........ | 360/324.11 |

(Continued)

FOREIGN PATENT DOCUMENTS

| | | |
|---|---|---|
| JP | 09-172212 | 6/1997 |
| JP | 2003-218428 | 7/2003 |
| JP | 2004-221526 | 8/2004 |
| JP | 2007-081126 | 3/2007 |

OTHER PUBLICATIONS

Maat, S., Carey, M., and Childress, J., App. Phys. Let., 93, 143505 (2008).*

(Continued)

*Primary Examiner* — Kevin Bernatz
(74) *Attorney, Agent, or Firm* — Zilka-Kotab, PC

(57) ABSTRACT

Embodiments of the present invention provide a practical magneto-resistive effect element for CPP-GMR, which exhibits appropriate resistance-area-product and high magnetoresistance change ratio, and meets the demand for a narrow read gap. Certain embodiments of a magneto-resistive effect element in accordance with the present invention include a pinned ferromagnetic layer containing a first ferromagnetic film having a magnetization direction fixed in one direction, a free ferromagnetic layer containing a second ferromagnetic film having a magnetization direction varying in response to an external magnetic field, an intermediate layer provided between the pinned ferromagnetic layer and the free ferromagnetic layer, and a current confinement layer for confining a current. At least one of the pinned ferromagnetic layer or the free ferromagnetic layer includes a highly spin polarized layer.

19 Claims, 4 Drawing Sheets

(56) References Cited

U.S. PATENT DOCUMENTS

| | | | |
|---|---|---|---|
| 2004/0257719 A1* | 12/2004 | Ohba et al. | 360/324.2 |
| 2006/0044703 A1 | 3/2006 | Inomata et al. | |
| 2006/0050444 A1* | 3/2006 | Fukuzawa et al. | 360/324 |
| 2006/0209472 A1* | 9/2006 | Koui et al. | 360/324.1 |
| 2007/0058301 A1 | 3/2007 | Shimazawa et al. | |
| 2007/0183098 A1* | 8/2007 | Tsuchiya et al. | 360/324.1 |
| 2007/0201169 A1* | 8/2007 | Ide et al. | 360/324.11 |
| 2007/0217087 A1 | 9/2007 | Hirata et al. | |
| 2008/0195214 A1* | 8/2008 | Chiba et al. | 623/18.11 |
| 2008/0198514 A1 | 8/2008 | Jogo et al. | |
| 2009/0027813 A1* | 1/2009 | Carey et al. | 360/324.12 |
| 2009/0257151 A1* | 10/2009 | Zhang et al. | 360/324.2 |
| 2010/0330394 A1* | 12/2010 | He et al. | 428/811.2 |
| 2011/0043950 A1* | 2/2011 | Carey et al. | 360/320 |

OTHER PUBLICATIONS

Yilgin, R., Oogane, M., Yakata, S., Ando, Y., and Miyazaki, T., IEEE Trans. Mag., v41(10), 2799 (2005).*

Kubota, T., Tsunegi, S., Oogane, M., Mizukami, S., Miyazaki, T., Naganuma, H., and Ando, Y., App. Phys. Let., 94, 122504 (2009).*

Caballero et al. "Effect of Deposition Parameters on the CPP-GMR of NiMnSb-Based Spin-Valve Structures", Journal of Magnetism and Magnetic Materials, pp. 55-57 (1999).

Fukuzawa et al. "Nanoconstricted Structure for Current-Confined Path in Current-Perpendicular-To-Plane Spin Valves With High Magnetoresistance", Journal of Applied Physics 97, 10C509 (2005).

* cited by examiner $(Co_{0.66}Mn_{0.34})_{1-x}Ge_x$ $(Co_{0.5}Fe_{0.5})_{1-x}Ge_x$

MAGNETO-RESISTIVE EFFECT ELEMENT, MAGNETIC HEAD, AND MAGNETIC RECORDING/READING APPARATUS

CROSS-REFERENCE TO RELATED APPLICATION

The instant nonprovisional patent application claims priority to Japanese Patent Application No. 2007-339432, filed Dec. 28, 2007 and which is incorporated by reference in its entirety herein for all purposes.

BACKGROUND OF THE INVENTION

With a trend toward higher-density magnetic recording, spin-valve giant magneto-resistive effect heads have been used as read heads of HDDs (Hard Disk Drives), and, to the present, the improvement of the film structure has increased their reading output. A spin-valve giant magneto-resistive effect head has a laminated structure of antiferromagnetic layer/pinned layer/non-magnetic intermediate layer/free layer, in sequence. The magnetization of the pinned layer is fixed by an exchange coupling magnetic field generated at the interface between the antiferromagnetic film and the pinned layer, while the magnetization of the free layer is reversed by an external magnetic field, thus changing the relative magnetization directions in the pinned layer and the free layer. This causes a change in electrical resistance, whereby a magnetic field is detected. In this case, the applied current is parallel to the film surface. Such a mode that applies a current parallel to a film surface is generally called CIP (Current-in-Plane). In recent years, in order to further increase output, research and development have been conducted on TMR (Tunneling Magneto-resistive) heads and CPP (Current Perpendicular to Plane)-GMR (Giant Magneto-resistive) heads, wherein a current flows perpendicularly to the film surface. TMR heads develop magnetoresistance with the spin-dependent tunneling effect, and thus have high magnetoresistance change ratio (MR ratio). However, although the MR ratio is high, an insulating layer is required for a magnetic tunnel junction, and accordingly, the resistance-area product (RA) thereof is as high as several $\Omega\mu m2$. Therefore, in case of a small element, the head resistance is high, resulting in poor high-frequency characteristics. TMR heads are thus disadvantageous in high-speed transmission.

As a CPP-GMR head, when a current is applied perpendicularly to the film surface in a structure as with the conventional CIP-GMR, the resulting MR ratio is low, and practical application thereof is thus difficult. In order to achieve higher MR ratio, research has been conducted on the application of a half metal to a ferromagnetic layer. Half metal is a metal in which only spin-up or spin-down electrons exist at the vicinity of Fermi surface. Such a metal makes a huge difference in mean free path between the spin-up conduction electrons and spin-down conduction electrons, possibly resulting in high MR ratio. J. Magn. Magn. Mater., 198-199, 55 (1999) ("Nonpatent Document 1") discloses a CPP-GMR sensor containing a Heusler alloy, a kind of half metal. Although the MR ratio is not so high, about 8% at 4.2 K, the disclosure is significant in showing a possibility that Heusler alloys are applicable to a CPP-GMR element.

JP-A-2003-218428 ("Patent document 1") discloses an invention that uses, as a material for a Heusler alloy, $Co_2MnZ$ (Z=Al, Si, Ga, Ge, Sn) for a CPP-GMR element. JP-A-2004-221526 ("Patent document 2") discloses an invention that uses $Co_2(Fe_xCr_{1-x})Al$ for a TMR element or CPP-GMR element. JP-A-2007-81126 ("Patent document 3") discloses an invention that uses $(CoPd)MnZ$ (Z=Sn, Ge, Si) and (CoX)MnSn (X=Rh, Ru, Ir) for CPP-GMR elements.

These CPP-GMR elements may have a dual spin-valve structure to have further increased MR ratio. However, they do not meet the demand for a small read gap for increasing the resolution of the magnetic head. Moreover, all the CPP-GMR elements disclosed in Patent Documents 1 to 3 are formed of metal films, thus having low RA, and therefore involve a problem in that sufficient output cannot be yielded unless the element size is considerably small to increase the head resistance.

As another structure, Japanese Patent No. 3,293,437 ("Patent Document 4") suggests a CPP-GMR element having inserted therein a nonmagnetic film comprising a mixture of an insulating material and a conductive material. If a spin-valve structure has such a layer comprising a complex of an insulating material and a conductive material, the current perpendicular to the film surface flows preferentially through the conductive material in the nonmagnetic film, and accordingly, the RA and MR ratio can be increased. J. Appl. Phys., 97, 10c509 (2005) ("Nonpatent Document 2") states that in a CPP-GMR element having a current confinement layer comprising AlCu, the MR ratio was 4.3% when RA=0.38 $\Omega\mu m2$. However, in order to achieve a high head SNR, still higher MR ratio is required.

As mentioned above, the MR ratio of a spin-valve CPP-GMR head is still too small to achieve a next-generation recording density of a level of 300 Gbit/in$^2$, and the sensitivity of the magneto-resistive effect element is also insufficient for this purpose. Moreover, because the recording density in the bit direction increases with an increase in the recording density, the shield gap has to be narrower to maintain high resolution.

Conventionally, CPP-GMR heads containing a Heusler alloy or like highly spin polarized material would require a thick highly spin polarized layer (generally 5 nm or more), so as to maintain the crystallinity of the highly spin polarized layer and obtain large spin-dependent bulk scattering. Otherwise, a dual spin-valve structure would be required to increase spin-dependent scattering. Whichever structure was employed, the total thickness of the read sensor would be large, and therefore, it was difficult to produce a CPP-GMR head ready for a small read gap. Moreover, it has been revealed that oxidation of a highly spin polarized material greatly degrades its characteristics, so simple combination with an oxide-containing current confinement layer was difficult.

BRIEF SUMMARY OF THE INVENTION

Embodiments of the present invention provide a practical magneto-resistive effect element for CPP-GMR, which exhibits appropriate resistance-area-product and high magnetoresistance change ratio, and meets the demand for a narrow read gap. As shown in FIG. 1, certain embodiments of a magneto-resistive effect element in accordance with the present invention include a pinned ferromagnetic layer containing a first ferromagnetic film 117 having a magnetization direction fixed in one direction, a free ferromagnetic layer containing a second ferromagnetic film 123 having a magnetization direction varying in response to an external magnetic field, an intermediate layer 121 provided between the pinned ferromagnetic layer and the free ferromagnetic layer, and a current confinement layer 120 for confining a current. At least one of the pinned ferromagnetic layer or the free ferromagnetic layer includes a highly spin polarized layer.

DETAILED DESCRIPTION OF THE INVENTION

Figure 1:
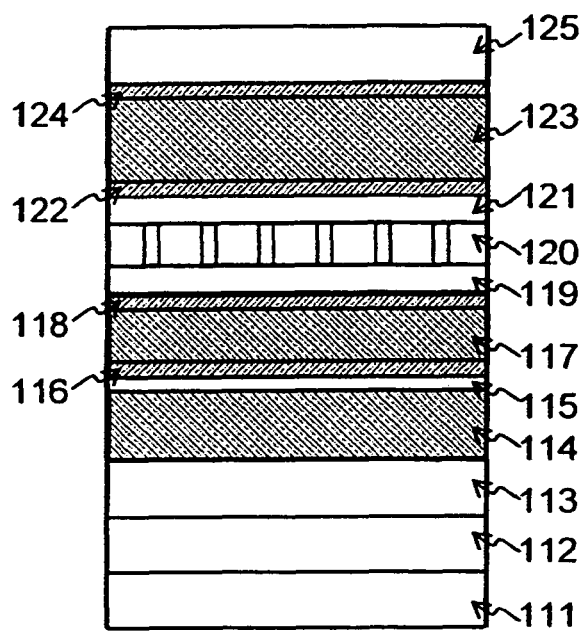
FIG. 1 schematically shows the CPP-GMR element of an embodiment of the invention.

Embodiments of the present invention were accomplished in view of the above problems. An object of embodiments of the invention is to provide a CPP-GMR element structure having high MR ratio and high sensitivity and being suitable for high-density recording; and a magnetic recording apparatus provided with the CPP-GMR element.

Embodiments of the present invention relate to a magneto-resistive effect element, a magnetic head, and a magnetic recording/reading apparatus, which are suitable for high-density magnetic recording.

In order to achieve the above object, the magneto-resistive effect element according to an embodiment of the present invention comprises a pinned layer including a first ferromagnetic film having a magnetization direction substantially fixed in one direction, a free layer including a second ferromagnetic film having a magnetization direction varying in response to an external magnetic field, and an intermediate layer provided between the pinned layer and the free layer. At least one of the pinned layer and the free layer contains a highly spin polarized material. The intermediate layer partially comprises a current confinement layer for confining a current.

Owing to this structure, a current is confined in the current confinement layer, and therefore, the RA and the MR ratio are mostly controlled by the resistance of the current confinement portion. As a result, in contrast with the conventional products, a portion that contributes to the resistance change due to spin-dependent scattering can be localized in the proximity of the current confinement portion of the ferromagnetic film, which makes it possible to reduce the thickness of the film of the highly spin polarized material. Accordingly, the demand for a small read gap can be met.

Further, a magneto-resistive effect head employing the magneto-resistive effect film of an embodiment of the invention can be used in combination with an induction-type thin-film magnetic head or with a perpendicular recording head to give an excellent magnetic head. Such a magnetic head can be mounted on a magnetic recording/reading apparatus.

Highly spin polarized material as used herein is an alloy with a stoichiometric composition close to $X_2YZ$ or XYZ, which partially has the $L2_1$ structure or B2 structure. Highly spin polarized materials indicate materials having higher spin polarization as compared with the spin polarization P of 0.3 to 0.5 of CoFe or like metallic magnetic materials used in pinned layers and free layers of conventional CPP-GMR elements.

According to embodiments of the present invention, a current is confined in the current confinement layer, and therefore, of the spin-dependent scattering in the highly spin polarized material, only the scattering in the proximity of the electroconductive portion of the current confinement layer contributes greatly to the MR ratio. The contribution of the spin-dependent scattering at a portion distant in the thickness direction from the conductive portion is thus relatively small. As a result, even using a highly spin polarized layer thinner than ever, sufficiently high MR ratio can be obtained. Accordingly, a magneto-resistive effect film being ready for a small read gap and having appropriate resistance with high MR ratio can be provided.

In the following Examples, embodiments of the present invention will be explained in further detail with reference to the drawings.

EXAMPLE 1

Effects of Combining Current Confinement Layer with Highly Spin Polarized Material FIG. 1 schematically shows a section of the CPP-GMR film according to an embodiment of the present invention.

Specifically, on a lower shield 111 that also serves as the electrode, the following layers are formed: an underlayer 112, an antiferromagnetic layer 113, a first pinned ferromagnetic layer 114, an antiparallel coupling layer 115, a first interface magnetic layer 116, a second pinned ferromagnetic layer 117, a second interface magnetic layer 118, an antioxidant layer 119, a current confinement layer 120, an intermediate layer 121, a third interface magnetic layer 122, a free ferromagnetic layer 123, a fourth interface magnetic layer 124, and a cap layer 125. The underlayer 112 is important for controlling the crystal orientation in the films laminated thereon. In this example, a multilayer Ta (3 nm)/Ru (2 nm) film was used as the underlayer 112. In addition, a monolayer film of Al, Cu, Cr, Fe, Nb, Hf, Ni, Ta, Ru, NiFe, NiCr, NiFeCr, etc., or a multilayer film of these materials are also usable. MnIr, MnIrCr, MnPt, and like antiferromagnetic materials can be used for the antiferromagnetic layer 113. CoFe (3 nm) was used for the first pinned ferromagnetic layer 114, and Ru (0.8 nm) was used for the antiparallel coupling layer 115. $Fe_{50}Co_{50}$ (0.5 nm) was used as the first interface magnetic layer 116. The first interface magnetic layer 116 is important for preventing the interdiffusion of materials between the antiparallel coupling layer 115 and the second pinned ferromagnetic layer 117. The presence of a first interface magnetic layer 116 increases the antiparallel coupling strength between the first pinned ferromagnetic layer 114 and the second pinned ferromagnetic layer 117, so that the magnetization of the pinned layers tends to remain stationary and stable against an external magnetic field. For the first interface magnetic layer 116, not only $Fe_{50}Co_{50}$ but also Fe, Co, Ni, or an alloy of two or more of these elements may be used.

CoFe- or NiFe-based magnetic materials and highly spin polarized materials may be used for the second pinned ferromagnetic layer 117. In this example, $Co_{50}Mn_{25}Ge_{25}$ (3 nm) was used as a highly spin polarized material. The second interface magnetic layer 118 is important for preventing interdiffusion at the interface and oxidization, and also for controlling crystal orientation. Fe, Co, Ni, or an alloy of two or more of these elements may be used therefor. In this example, $Fe_{50}Co_{50}$ (0.5 nm) was used for the second interface magnetic layer 118.

Cu was used for the antioxidant layer 119. Au, Ag, Cr, and the like may also be used. This layer is important for preventing the diffusion of oxygen from the current confinement layer into the second interface magnetic layer 118 and the second pinned ferromagnetic layer 117, and serves as a substrate for the efficient progress of the separate formation of a conductive portion and an insulating portion in the current confinement layer.

$Al_{90}Cu_{10}$ having a thickness of 1 nm was used for the current confinement layer 120 in this example. The current confinement layer was reactively sputtered in an argon/oxygen environment with an oxygen partial pressure of 10%. The material for the current confinement layer should be a combination of materials that easily undergo phase separation and develop magnetoresistance through a conductive portion. An oxide of Al, Si, Mg, Ti, Ta, or the like may be used for an insulating portion. For a conductive portion, Au, Ag, Cu, Pt, Pd, Ru, Rh, Co, Ni, and Fe can be used.

A current confinement layer may be formed, for example, by discharging an insulator target such as $Al_2O_3$, $SiO_2$, Mg—O, Ti—O, and Ta—O, simultaneously with a metal target such as Au, Ag, Cu, Pt, Pd, Ru, Rh, Co, Ni, and Fe, in a spattering apparatus.

The thus formed current confinement layer 120 was subjected to reverse spattering and thus etched, whereby the surface was physically shaved to improve the surface smoothness. As a way of smoothing, not only reverse spattering but also low-angle IBE or GCIB etching achieves the same effects.

In this example, Cu (0.5 nm) was used for the intermediate layer 121. The intermediate layer 121 is important for preventing the diffusion of oxygen from the current confinement layer into the third interface magnetic layer 122 and the free ferromagnetic layer 123, and also for improving the soft magnetic properties of the free ferromagnetic layer 123. For the intermediate layer 121, not only Cu but also Au, Ag, Cr, and the like may be used.

$Fe_{50}Co_{50}$ (0.5 nm) was used for the third interface magnetic layer 122. Not only $Fe_{50}Co_{50}$ but also Fe, Co, Ni, or an alloy of two or more of these elements may be used for the third interface magnetic layer 122.

CoFe- or NiFe-based magnetic materials and highly spin polarized materials can be used for the free ferromagnetic layer 123. In this example, $Co_{50}Mn_{25}Ge_{25}$ (3 nm) was used as a highly spin polarized material.

$Fe_{50}Co_{50}$ (0.5 nm) was used for the fourth interface magnetic layer 124 in this example. This layer prevents the interdiffusion between the free ferromagnetic layer 123 and the cap layer 125, and also alleviates the effects of the crystal structure of the cap layer on the free ferromagnetic layer 123. Not only $Fe_{50}Co_{50}$ but also Fe, Co, Ni, and an alloy of two or more of these materials may be used for the fourth interface magnetic layer 124. As additive elements, materials including Au, Ag, Cu, Pt, Pd, Ru, Ge, Mn, Al, and Sb may also be used.

Ru (3 nm)/Cu (2 nm) was used for the cap layer 125. As the cap layer 125, a monolayer Cu, Ru, Ta, or Rh film, or a laminated film comprising a combination of these materials may also be used.

The current-confinement CPP-GMR film formed in embodiments of the present invention was processed by normal ion milling and photolithography to give a CPP-GMR element having a size of 0.3×0.3 μm² to 5.0×5.0 μm². From the element resistance and the area dependence of the resistance change, resistance-area product RA and resistance-change area product ΔRA were calculated.

Table 1 shows the properties of the following elements: as Comparative Example 1, a CPP-GMR element consisting of metals, wherein the magnetic layer comprises a highly spin polarized material $Co_{50}Mn_{25}Ge_{25}$, and the intermediate layer comprises Cu; as Comparative Example 2, a current-confinement CPP-GMR element, wherein the magnetic layer comprises $Co_{90}Fe_{10}$, and the current confinement layer comprises $Al_{90}Cu_{10}$; and, as Example 1, a CPP-GMR element, wherein a highly spin polarized material $Co_{50}Mn_{25}Ge_{25}$ is used in combination with $Al_{90}Cu_{10}$ of the current confinement layer.

TABLE 1

| | Structure | Sensor Thickness (nm) | RA ($\Omega \mu m^2$) | MR ratio (%) |
|---|---|---|---|---|
| Comp. Ex. 1 | Ta3/Ru2/MnIr6/CoFe2.5/Ru0.8/ CoFe0.5/CoMnGe3/CoFe0.5/ Cu2/CoFe0.5/CoMnGe3/ CoFe0.5/Cu2/Ru3 | 29.3 | 0.06 | 6.8 |
| Comp. Ex. 2 | Ta3/Ru2/MnIr6/CoFe2.5/Ru0.8/ CoFe4/Cu0.5/AlCu-O1/ Cu0.5/CoFe4/Cu2/Ru3 | 29.3 | 0.2 | 5.2 |
| Ex. 1 | Ta3/Ru2/MnIr6/CoFe2.5/Ru0.8/ CoFe0.5/CoMnGe3/CoFe0.5/ Cu0.5/AlCu-O1/ Cu0.5/CoFe0.5/CoMnGe3/ CoFe0.5/Cu2/Ru3 | 29.3 | 0.2 | 18.2 |

In order to meet the demand for a small read gap, the sensors in Reference Example 1, Reference Example 2, and Example 1 were all formed to have a thickness of 29.3 nm. In Comparative Example 1 and Example 1, because the highly spin polarized layer and the interface magnetic layer both contribute to MR ratio, the highly spin polarized layer and the interface magnetic layer were designed to have a total thickness of 4 nm. To make a fair comparison, the $Co_{90}Fe_{10}$ film of Comparative Example 2 was also designed to have a thickness of 4 nm. Such elements of Comparative Example 1 and Comparative Example 2 give an MR ratio of about 5 to 6% at most. In contrast, in the Example 1, the MR ratio can be as high as 18.2%. Thus, the application of the structure of the Example makes it possible to provide a magneto-resistive effect element having high MR ratio and being ready for a small read gap.

EXAMPLE 2

Variation of Free Layer Thickness

Figure 2:
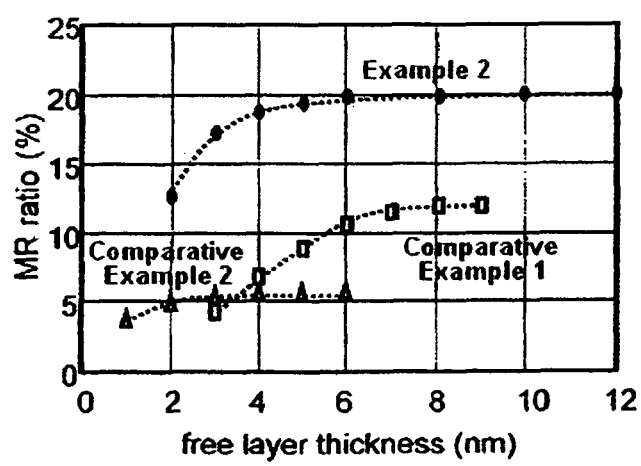
FIG. 2 shows the free-layer-thickness dependence of MR ratio of a CPP-GMR element according to one embodiment of the invention and that of a comparative CPP-GMR element.

FIG. 2 shows the MR ratio corresponding to varying thickness of the free ferromagnetic layer in the structure of Example 1 shown in Table 1.

With respect to Comparative Example 1 and Example 1 in Table 1, the free layer thickness on the abscissa of FIG. 2 is calculated as a total thickness of a three-layered free layer including the third interface magnetic layer 122, the fourth interface magnetic layer 124, and the free ferromagnetic layer 123. Change in the thickness was made by changing only the thickness of the $Co_{50}Mn_{25}Ge_{25}$ layer. The free layer thickness in Comparative Example 2 is the thickness of a monolayered $Co_{90}Fe_{10}$ free layer.

Comparing the results obtained in Comparative Example 1, Comparative Example 2, and Example 2, under the condition that the free layers have the same thickness, Example 2 gives highest MR ratio.

Through Comparative Example 1, Comparative Example 2, and Example 2, a thicker free layer is more preferable for achieving high MR ratio. However, this brings an increase in the total thickness of the sensor, making it difficult to achieve high resolution. Further, this also leads to a large result of the free layer magnetization×thickness, and thus, it becomes difficult to fix the magnetization direction in one direction by a hard bias. Therefore, simple thickening of the free layer to increase the MR ratio does not achieve high recording density. In general, a free layer thickness of about 12 nm or less is believed to be suitable for achieving a resolution of more than 300 Gb/in$^2$. A thinner free layer leads to a lower total sensor thickness, making it easier to achieve high resolution. Especially, in case of Example 2, an MR ratio greater than 10% can be obtained even when the free layer thickness is as extremely small as 2 nm. Accordingly, reduction of the total thickness of the sensor is possible, and the result of magnetization×thickness can also be small. This enables easy magnetization control by a hard bias. Therefore, when the free layer has a thickness of 2 nm or more, wherein the $Co_{50}Mn_{25}Ge_{25}$ film has a thickness of 1 nm or more, it is possible to achieve both high resolution over 300 Gb/in$^2$ and high output.

EXAMPLE 3

Presence/Absence of Interface

Samples were prepared as in Example 1, with employing or not employing a second interface magnetic layer 118, an antioxidant layer 119, an intermediate layer 121, and a third interface magnetic layer 122. The materials therefor were also changed from those used in Example 1. Table 2 shows the RA and the MR ratio for each structure. An upward arrow in the table expresses that the material therein is the same as one indicated by the arrow.

As indicated in Table 2, No. 2-1 to No. 2-5, the samples all have an MR ratio greater than 12% even in the absence of an interface magnetic layer, an antioxidant layer, and an intermediate layer. However, the absence of a second interface magnetic layer 118 or a third interface magnetic layer 122 results in reduced MR ratio as compared with Example 1. Accordingly, the presence of second and third interface magnetic layers is preferable.

The absence of an antioxidant layer 119 tends to increase RA. Control on the current confinement layer 120 to reduce the RA decreases the MR ratio. This is because oxidation proceeds into a pinned layer. In order to prevent this problem, the presence of an antioxidant layer 119 is preferable.

In the absence of an intermediate layer 121, although high MR ratio can be obtained at low RA, the soft magnetic properties of the free layer are slightly degraded. Accordingly, the presence of an intermediate layer is preferable.

Table 2 shows, in No. 2-6 to 2-9, the RA and the MR ratio of samples having the same structure as in Example 1, with the materials for the second interface magnetic layer 118 and the third interface magnetic layer 122 being changed into Co and $Co_{66}Ni_{16}Fe_{18}$. The data show that use of Fe, Co, Ni, or an alloy of two or more of these materials for the interface magnetic layer also achieves high MR ratio.

The Table 2 shows, in No. 2-10 to 2-12, the RA and the MR ratio of samples having the same structure as in Example 1, with the materials for the antioxidant layer 119 and the intermediate layer 121 being changed into Au, Ag, and Cr. The data show that use of Au, Ag, or Cr also achieves high MR ratio.

EXAMPLE 4

Various Highly Spin Polarized Materials, Various Compositions

Samples were prepared as in Example 1, with the materials for the second pinned ferromagnetic layer 117 and the free

TABLE 2

| No. | Second Interface Magnetic Layer 118 | Antioxidant Layer 119 | Intermediate Layer 121 | Third Interface Magnetic Layer 122 | RA ($\Omega\mu m^2$) | MR Ratio (%) |
|---|---|---|---|---|---|---|
| Ex. 1 | $Co_{50}Fe_{50}$ (0.5 nm) | Cu (0.5 nm) | Cu (0.5 nm) | $Co_{50}Fe_{50}$ (0.5 nm) | 0.20 | 18.2 |
| 2-1 | None | ↑ | ↑ | ↑ | 0.42 | 15.2 |
| 2-2 | $Co_{50}Fe_{50}$ (0.5 nm) | None | ↑ | ↑ | 1.23 | 16.4 |
| 2-3 | ↑ | Cu (0.5 nm) | None | ↑ | 0.18 | 19.2 |
| 2-4 | ↑ | ↑ | Cu (0.5 nm) | None | 0.26 | 12.6 |
| 2-5 | ↑ | ↑ | ↑ | $Co_{50}Fe_{50}$ (0.5 nm) | 0.20 | 18.2 |
| 2-6 | Co (0.5 nm) | ↑ | ↑ | ↑ | 0.31 | 14.3 |
| 2-7 | $Co_{50}Fe_{50}$ (0.5 nm) | ↑ | ↑ | Co (0.5 nm) | 0.16 | 12.6 |
| 2-8 | $Co_{66}Ni_{16}Fe_{18}$ (0.5 nm) | ↑ | ↑ | $Co_{50}Fe_{50}$ (0.5 nm) | 0.46 | 11.2 |
| 2-9 | $Co_{50}Fe_{50}$ (0.5 nm) | ↑ | ↑ | $Co_{66}Ni_{16}Fe_{18}$ (0.5 nm) | 0.21 | 10.7 |
| 2-10 | ↑ | Au (0.5 nm) | Au (0.5 nm) | $Co_{50}Fe_{50}$ (0.5 nm) | 0.31 | 14.3 |
| 2-11 | ↑ | Ag (0.5 nm) | Ag (0.5 nm) | ↑ | 0.16 | 12.6 |
| 2-12 | ↑ | Cr (0.5 nm) | Cr (0.5 nm) | ↑ | 0.22 | 9.9 | ferromagnetic layer 123 being changed. Table 3 shows the RA and the MR ratio for each composition.

TABLE 3

| Sample No. | Second Pinned Ferromagnetic Layer 117 | Free Ferromagnetic Layer 123 | RA ($\Omega\,\mu m^2$) | MR Ratio (%) |
| --- | --- | --- | --- | --- |
| Ex. 1 | CoMnGe | CoMnGe | 0.20 | 18.2 |
| 3-1 | GoFe | CoMnGe | 0.31 | 11.2 |
| 3-2 | CoMnGe | CoFe | 0.25 | 10.7 |
| 3-3 | CoMnAl | CoMnAl | 0.18 | 18.0 |
| 3-4 | CoMnSi | CoMnSi | 0.21 | 16.3 |
| 3-5 | CoMnGa | CoMnGa | 0.16 | 12.3 |
| 3-6 | CoMnSn | CoMnSn | 0.20 | 12.0 |
| 3-7 | CoFeGe | CoFeGe | 0.33 | 15.2 |
| 3-8 | CoFeAl | CoFeAl | 0.24 | 17.9 |
| 3-9 | CoFeSi | CoFeSi | 0.24 | 16.5 |
| 3-10 | CoFeGa | CoFeGa | 0.31 | 14.0 |
| 3-11 | CoFeSn | CoFeSn | 0.18 | 11.0 |

As shown in Table 3 with the data for the samples No. 3-1 and No. 3-2, MR ratio decreases when either the second pinned ferromagnetic layer 117 or the free ferromagnetic layer 123 comprises CoFe; however, such an MR ratio is not less than 10%, and thus is still higher than conventional CPP-GMR elements. Further, as shown in Table 3 with the data for the samples No. 3-3 to No. 3-11, as highly spin polarized materials, not only CoMnGe but also CoMnAl, CoMnSi, CoMnGa, CoMnSn, CoFeGe, CoFeAl, CoFeSi, CoFeGa, and CoFeSn may be used to achieve high MR ratio.

Figure 3:
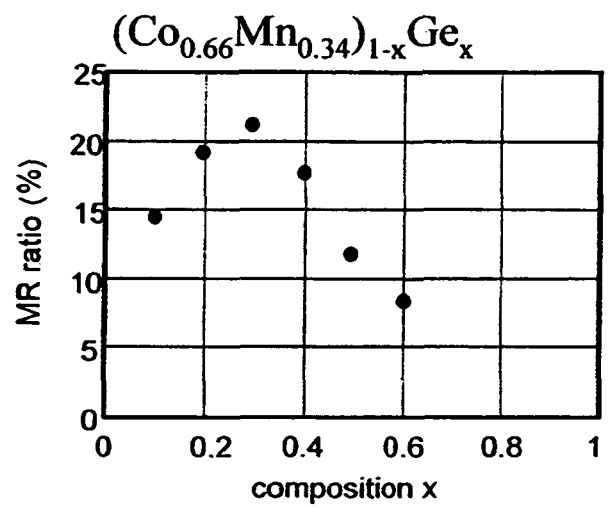
FIG. 3 shows the Ge-proportion dependence of MR ratio when $(Co_{0.66}Mn_{0.34})_{1-x}Ge_x$ is used as a highly spin polarized material, according to one embodiment of the invention.
Figure 4:
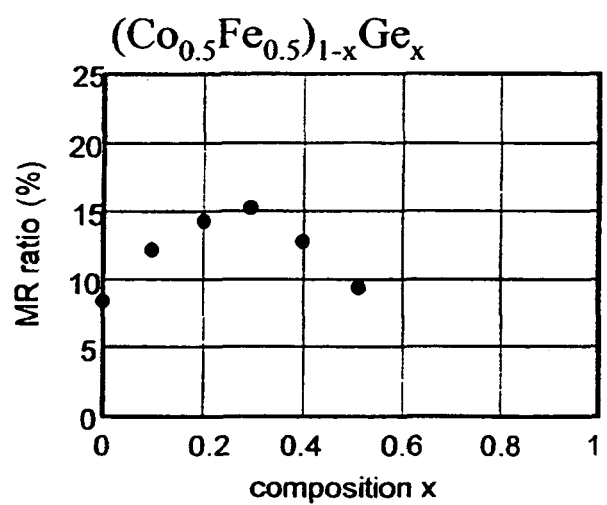
FIG. 4 shows the Ge-proportion dependence of MR ratio when $(Co_{0.5}Fe_{0.5})_{1-x}Ge_x$ is used as a highly spin polarized material, according to one embodiment of the invention.

FIG. 3 shows the result of application of $(Co_{0.66}Mn_{0.34})_{1-x}Ge_x$ (3 nm) for a highly spin polarized layer in the structure of Example 1, changing the Ge proportion x at. %. The data show that MR ratio is observed even when the Ge proportion greatly deviates from Co:Mn:Ge=2:1:1, which is the stoichiometric composition of CoMnGe having the L21 structure. In particular, when the Ge proportion is 30 at %, highest MR ratio is observed. Similarly, FIG. 4 shows the result of application of $(Co_{0.5}Fe_{0.5})_{1-x}Ge_x$ for a highly spin polarized layer. In this case as well, MR ratio was observed even when the proportion of Ge was changed greatly. The reason for this is possibly that even when a Heusler alloy has no complete, ordered lattice such as the L21 or B2 structure, if its structure partially has high ordering, confinement of a current in the proximity of such a portion gives sufficiently high MR ratio. Even when the component of the highly spin polarized material partially segregates to the grain boundary, etc., this has no adverse effect on spin-dependent scattering insofar as the segregation portion is not in contact with the conductive portion of the current confinement layer. As a result, the decrease in MR ratio can be minimized.

Moreover, when a crystalline material is used for the conductive portion of the current confinement layer, the current path from the pinned ferromagnetic layer through the conductive portion to the free ferromagnetic layer is often formed epitaxially without involving the grain boundary. Accordingly, the resulting current path has high crystal continuity. Under such a condition, when a current spin-polarized at one highly spin polarized layer flows into the other highly spin polarized layer, defect- or impurity-induced scattering hardly occurs. Therefore, increased spin-dependent scattering can be expected.

EXAMPLE 5

Explanation of AlCu Composition

Figure 5:
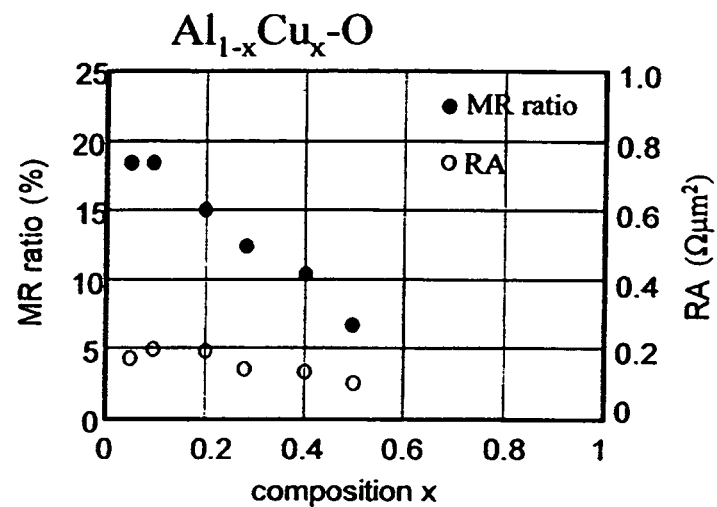
FIG. 5 shows the Cu-proportion dependence of MR ratio and RA when $Al_{1-x}Cu_x$ is used for a current confinement layer, according to one embodiment of the invention.

Samples were prepared as with the magneto-resistive effect element produced in Example 1, with the Cu proportion in the $Al_{90}Cu_{10}$ used for the current confinement layer 120 being changed. FIG. 5 shows the MR ratio and the RA at each Cu proportion. The $Al_{1-x}Cu_x$ film thickness was controlled so that the RA at each Cu proportion was within a range of 0.1 $\Omega\mu m2$ to 0.2 $\Omega\mu m2$. As shown in the graph, an MR ratio greater than 10% is obtained within a Cu proportion range of 5 to 40 at. %. A Cu proportion greater than 50 at. % results in insufficient current confinement in a current confinement layer, making it difficult to obtain high MR ratio. Accordingly, in $Al_{1-x}Cu_x$, a Cu proportion of 5 to 40 at. % is preferable.

EXAMPLE 6

Explanation of Head

Figure 6:
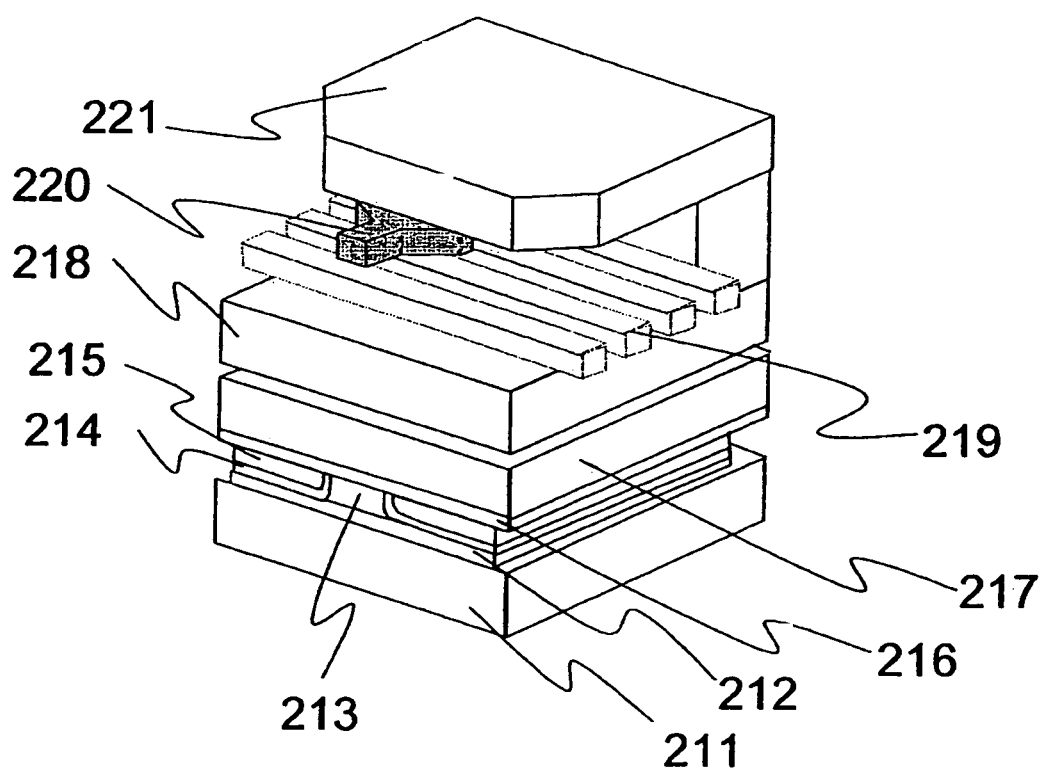
FIG. 6 schematically shows a recording/reading separated magnetic head for perpendicular recording.

FIG. 6 schematically shows a recording/reading separated magnetic head for perpendicular recording, provided with the magneto-resistive effect element of the invention. The read head comprises, on a substrate that also serves as a slider, a lower first shield 211, a second shield 212, a CPP-GMR film 213, an insulating gap film 214, a magnetic-domain-controlling film 215, a conductive gap film 216, and an upper shield 217. Above the read head is provided a perpendicular recording head comprising an auxiliary magnetic pole 218, a coil 219, a main magnetic pole 220, and a yoke 221.

Embodiments of the invention relate to a magneto-resistive effect head, and thus are applicable where the recording head is a perpendicular recording head or a longitudinal recording head. However, embodiments employed with a perpendicular recording head may provide more efficient functions.

EXAMPLE 7

Explanation of Drive

Figure 7:
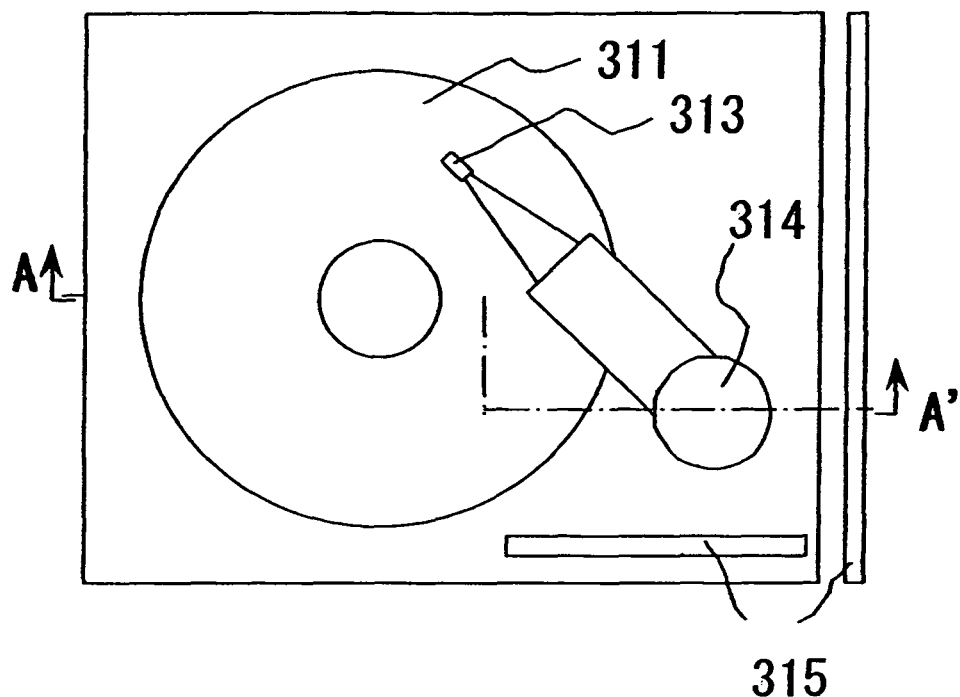
FIG. 7 schematically shows a magnetic disk drive.
Figure 8:
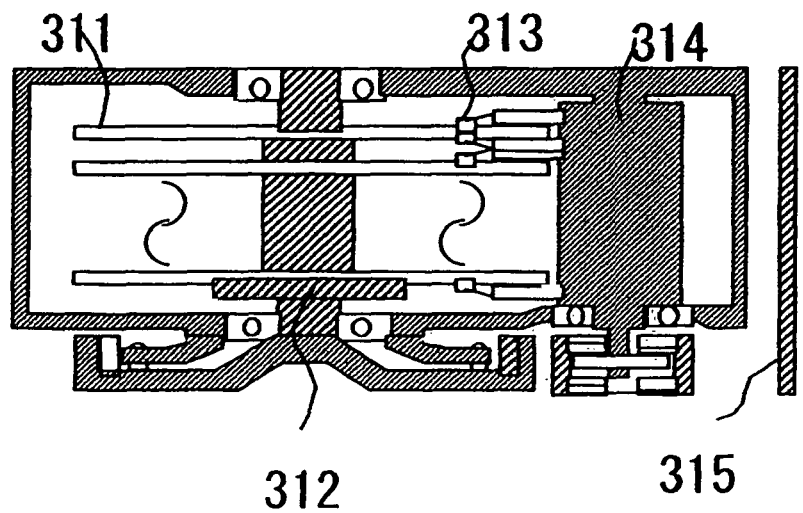
FIG. 8 schematically shows a section of a magnetic disk drive.

A magnetic disk drive was produced using the recording/reading separated magnetic head for perpendicular recording produced in Example 6. FIGS. 7 and 8 schematically show the magnetic disk drive. FIG. 7 is a schematic plan view. FIG. 8 is the AA' sectional view. As a magnetic recording medium 311, a granular medium for perpendicular recording comprising CoCrPt and $SiO_2$ was used. As a magnetic head 313, the head of Example 6 was used. The recording medium 311 that magnetically records information is rotated by a spindle motor 312, and the head 313 is guided onto the truck of the recording medium 311 by an actuator 314. That is, in the magnetic disk drive, owing to this mechanism, the read head and the recording head formed on the head 313 approach the predetermined recording position on the recording medium 311 and make relative motions, thereby successively writing and reading signals. The recording head records the signals on the medium through a signal-processing system 315. The output from the read head through the signal-processing system 315 is obtained as a signal.

With respect to the above structure, examinations were performed on the magnetic head of the invention and the magnetic recording/reading apparatus provided with the same. As a result, sufficient output and excellent bias characteristics were observed. Moreover, the operation was highly reliable. This is because the application of the structure of the invention achieves high MR ratio at low RA.

What is claimed is:

1. A magneto-resistive effect element comprising:
    a first pinned ferromagnetic layer including a first ferromagnetic film having a magnetization direction fixed in one direction;
    an antiparallel coupling (APC) layer positioned above the first pinned ferromagnetic layer, the APC layer comprising Ru;
    a first interface magnetic layer positioned at an upper interface of the APC layer;
    a second pinned ferromagnetic layer positioned above the first interface magnetic layer, the second pinned ferromagnetic layer including a second ferromagnetic film having a magnetization direction fixed in one direction;
    a second interface magnetic layer positioned at an upper interface of the second pinned ferromagnetic layer;
    a current confinement layer positioned above the second interface magnetic layer, the current confinement layer being configured to confine a current and consisting of a nonmagnetic conductive metal and an insulating material;
    a free ferromagnetic layer positioned above the current confinement layer, the free ferromagnetic layer including a third ferromagnetic film having a magnetization direction varying in response to an external magnetic field; and
    an intermediate layer positioned between the second pinned ferromagnetic layer and the free ferromagnetic layer; and
    a third interface magnetic layer positioned at a lower interface of the free ferromagnetic layer,
    wherein at least one of the second pinned ferromagnetic layer and the free ferromagnetic layer comprise a highly spin polarized layer, and wherein at least one of said second interface magnetic layer or third interface magnetic layer is a metallic alloy having at least one of Fe, Co and Ni.

2. A magneto-resistive effect element according to claim 1, wherein the highly spin polarized layer has a thickness of between about 1-11 nm.

3. A magneto-resistive effect element according to claim 1, wherein the highly spin polarized layer comprises CoMnZ, where Z is selected from the group consisting of Al, Si, Ga, Ge, and Sn.

4. A magneto-resistive effect element according to claim 1, wherein the highly spin polarized layer comprises CoFeZ, where Z is selected from the group consisting of Al, Si, Ga, Ge, and Sn.

5. A magneto-resistive effect element according to claim 1, wherein the highly spin polarized layer comprises CoMnGe.

6. A magneto-resistive effect element according to claim 1, wherein the insulating material comprises an oxide of at least one element selected from a group consisting of Al, Si, Mg, Ti, and Ta; and
    wherein the nonmagnetic conductive metal comprises at least one metal selected from a group consisting of Au, Ag, Cu, Pt, Pd, Ru, and Rh.

7. A magneto-resistive effect element according to claim 1, further comprising at least one antioxidant layer positioned between the current confinement layer and the highly spin polarized layer, the at least one antioxidant layer comprising Au, Ag, Cu, and/or Cr.

8. A magneto-resistive effect element according to claim 1, wherein the first, second, and third interface magnetic layers comprise at least one of Fe, Co, or Ni, or two or more elements selected therefrom.

9. A magnetic head comprising:
    a recording head, and
    a read head provided with a magneto-resistive effect element comprising a first pinned ferromagnetic layer including a first ferromagnetic film having a magnetization direction fixed in one direction, an antiparallel coupling (APC) layer positioned above the first pinned ferromagnetic layer, the APC layer comprising Ru, a first interface magnetic layer positioned at an upper interface of the APC layer, a second pinned ferromagnetic layer positioned above the first interface magnetic layer, the second pinned ferromagnetic layer including a second ferromagnetic film having a magnetization direction fixed in one direction, a second interface magnetic layer positioned at an upper interface of the second pinned ferromagnetic layer, a current confinement layer positioned above the second interface magnetic layer, the current confinement layer being configured to confine a current and consisting of a nonmagnetic conductive metal and an insulating material, a free ferromagnetic layer positioned above the current confinement layer, the free ferromagnetic layer including a third ferromagnetic film having a magnetization direction varying in response to an external magnetic field, and an intermediate layer positioned between the second pinned ferromagnetic layer and the free ferromagnetic layer, and a third interface magnetic layer positioned at a lower interface of the free ferromagnetic layer, at least one of the second pinned ferromagnetic layer and the free ferromagnetic layer comprise a highly spin polarized layer, and wherein at least one of said second interface magnetic layer or third interface magnetic layer is a metallic alloy having at least one of Fe, Co and Ni.

10. A magnetic head according to claim 9, wherein the highly spin polarized layer has a thickness of between about 1-11 nm.

11. A magnetic head according to claim 9, wherein the highly spin polarized layer comprises CoMnZ, where Z is selected from the group consisting of Al, Si, Ga, Ge, and Sn.

12. A magnetic head according to claim 9, wherein the highly spin polarized layer comprises CoFeZ, where Z is selected from the group consisting of Al, Si, Ga, Ge, and Sn.

13. A magnetic head according to claim 9, wherein the highly spin polarized layer comprises CoMnGe.

14. A magnetic recording/reading apparatus comprising:
    a magnetic recording medium;
    a medium-driving portion for driving the magnetic recording medium;
    a magnetic head for recording onto or reading from the magnetic recording medium; and
    an actuator for positioning the magnetic head on the magnetic recording medium,
    wherein the magnetic head is provided with a magneto-resistive effect element comprising a first pinned ferromagnetic layer including a first ferromagnetic film having a magnetization direction fixed in one direction, an antiparallel coupling (APC) layer positioned above the first pinned ferromagnetic layer, the APC layer comprising Ru, a first interface magnetic layer positioned at an upper interface of the APC layer, a second pinned ferromagnetic layer positioned above the first interface magnetic layer, the second pinned ferromagnetic layer including a second ferromagnetic film having a magnetization direction fixed in one direction, a second interface magnetic layer positioned at an upper interface of the second pinned ferromagnetic layer, a current confinement layer positioned above the second interface magnetic layer, the current confinement layer being configured to confine a current and consisting of a nonmagnetic conductive metal and an insulating material, a free ferromagnetic layer positioned above the current confinement layer, the free ferromagnetic layer including a third ferromagnetic film having a magnetization direction varying in response to an external magnetic field, and an intermediate layer positioned between the second pinned ferromagnetic layer and the free ferromagnetic layer, and a third interface magnetic layer positioned at a lower interface of the free ferromagnetic layer, at least one of the second pinned ferromagnetic layer and the free ferromagnetic layer comprise a highly spin polarized layer, and wherein at least one of said second interface magnetic layer or third interface magnetic layer is a metallic alloy having at least one of Fe, Co and Ni.

15. A magnetic recording/reading apparatus according to claim 14, wherein the highly spin polarized layer has a thickness of between about 1-11 nm.

16. A magnetic recording/reading apparatus according to claim 14, wherein the highly spin polarized layer comprises CoMnZ, where Z is selected from the group consisting of Al, Si, Ga, Ge, and Sn.

17. A magnetic recording/reading apparatus according to claim 14, wherein the highly spin polarized layer comprises CoFeZ, where Z is selected from the group consisting of Al, Si, Ga, Ge, and Sn.

18. A magnetic recording/reading apparatus according to claim 14, wherein the highly spin polarized layer comprises CoMnGe.

19. A magneto-resistive effect element according to claim 1, wherein the current confinement layer is $Al_{1-x}Cu_x$—O, where x is between about 5 to 40 at. %.

* * * * *